(12) United States Patent
Kim et al.

(10) Patent No.: US 6,970,210 B2
(45) Date of Patent: Nov. 29, 2005

(54) FOLDER TYPE MULTI DISPLAY DEVICE

(75) Inventors: Si Han Kim, 338-1, Daessangyong-Ri, Choweol-Myun, Kwangju-Kin, Kyunggi-Do (KR) 464-862; Jang Ho Kim, Kyunggi-Do (KR)

(73) Assignee: Si Han Kim, Kyunggi-Do (KR)

(*) Notice: Subject to any disclaimer, the term of this patent is extended or adjusted under 35 U.S.C. 154(b) by 0 days.

(21) Appl. No.: 10/432,172

(22) PCT Filed: Nov. 22, 2001

(86) PCT No.: PCT/KR01/02010

§ 371 (c)(1),
(2), (4) Date: May 20, 2003

(87) PCT Pub. No.: WO02/43379

PCT Pub. Date: May 30, 2002

(65) Prior Publication Data

US 2004/0036818 A1 Feb. 26, 2004

(30) Foreign Application Priority Data

Nov. 22, 2000 (KR) .............................. 2000-69713
Aug. 25, 2001 (KR) .............................. 2001-51507

(51) Int. Cl.$^7$ .......................................... G02F 1/1333
(52) U.S. Cl. .......................................... 349/58; 345/1.3
(58) Field of Search .................. 349/58–60; 345/1.1, 345/1.3

(56) References Cited

U.S. PATENT DOCUMENTS

| | | | |
|---|---|---|---|
| 5,734,513 A * | 3/1998 | Wang et al. | 359/742 |
| 5,877,836 A * | 3/1999 | Miura et al. | 349/184 |
| 6,507,377 B1 * | 1/2003 | Jung | 349/60 |
| 6,538,709 B1 * | 3/2003 | Kurihara et al. | 349/58 |
| 2002/0104769 A1 * | 8/2002 | Kim et al. | 206/320 |
| 2003/0189759 A1 * | 10/2003 | Kim et al. | 359/619 |

* cited by examiner

*Primary Examiner*—Andrew Schechter
(74) *Attorney, Agent, or Firm*—Norris McLaughlin & Marcus PA (57) ABSTRACT

A foldable multi-display device includes plural display panels that define a large-sized screen by being disposed to contact each other at their one side ends when they are unfolded, and that are received in a panel housing when they are folded in a state where only their one side ends are exposed outside. The panel housing includes a housing body for receiving at least two display panel, a supporting portion defined by cutting a sidewall of the housing body to support the display panels, an upper cover mounted on the housing body to cover non-display regions of the display panels, and an opening defined on the housing body to allow the display panels to contact each other at their one side ends when the display panels are unfolded. The foldable multi-display device further includes a connecting device for foldably supporting the panel housing.

21 Claims, 12 Drawing Sheets

FOLDER TYPE MULTI DISPLAY DEVICE

TECHNICAL FIELD

The present invention relates to a foldable multi display device that can realize the large-sized screen by connecting plural display panels, and more particularly to a multi display device that can improve the display quality by minimizing or eliminating the non-display area formed on the border between the adjacent display elements and protect the sidewalls of the display panels exposed when they are folded.

BACKGROUND ART

A multi display device is realized by using plural cathode ray tubes. However, in recent years, so as to effectively utilize the space of the office, flat display panels have been used to realize the multi display device.

As the flat display panels used for the multi display device, a liquid crystal display (LCD), a thin film transistor (TFT)-LCD, a field emission display (FED), a plasma display panel (PDP), an electro luminescent (EL), and an electric paper are usually used. As it is difficult to design such flat display panels in a large sized screen using a single unit due to the technology or economic problems, it is more effective to realize the large sized screen using the multi units.

Particularly, as the use of mobile phones, mobile computers, and personal digital assistance devices is increasingly increased, it is required to reduce the size, weight, and thickness of the flat display devices.

To realize the reduction in the size and weight and thickness of the flat display device, a foldable display where two display panels are foldably assembled such that the panels can realize a single large-sized screen when they are unfolded. Such foldable flat displays are designed to be closely adjacent at their one sidewalls to provide the enlarging effect of the screen.

A transparent protection film is attached on the border of the panels so as to provide the natural screen. However, when the panel is folded, since one sidewalls of the panels are exposed to the outside, it is not visually clear. In addition, when the folding and unfolding operations are repeated many times, the adhesive strength of the panels is weakened and alien substances may be formed on the adjacent sidewalls.

Furthermore, when the panel is unfolded, the sidewalls of the display panels cannot contacts simultaneously, an additional constitution or an additional operation for contacting the adjacent sidewalls of the panels is required.

DISCLOSURE OF INVENTION

The present invention has been made in an effort to solve the above described problems.

It is an objective of the present invention to provide a multi display device that can improve the display quality by minimizing the non-display area and can prevent the display panels from being damaged by receiving the panels inside except for the adjacent sidewalls.

To achieve the above objectives, the present invention provides a foldable multi display device, comprising a housing body receiving at least two display panels; a supporting portion for supporting the display panels, the supporting portion being defined by cutting sidewalls, proximal to contacting border portion, of the housing body; an upper cover for covering a non-display area of the display panels disposed on the housing body; and a panel housing having an opening such that the display panels can be adjacent to each other when the panels are unfolded.

The foldable multi display device may further comprise connecting means for supporting the panel housings such that they can be folded on each other and unfolded at 180°.

The connecting means comprises a hinge assembly mounted on a rotational center of the panel housing.

The supporting portion comprises a projection installed on other sidewall of the housing body.

The housing body further comprises a second supporting portion for supporting a driving circuit board and/or a backlight.

The supporting portion comprises an extension portion extending inside.

The foldable multi display device further comprises a protecting film disposed on sidewalls of the contacting border portion of the display panels and the housing body.

The display panel is assembled with a driving circuit board and/or a backlight by a chassis, and the chassis comprises a fixing member for preventing the panel assembly from moving and a supporting member for maintaining the panel assembly at a predetermined height. The display panel may be disposed on the chassis made of plate member.

According to another aspect, the present invention provides a multi display device comprising at least two panel housings with plural circuits and a central process unit, the panel housing being foldable; and display panels mounted on the panel housings, wherein the display panels having contacting border portion lies on a same plane of the sidewalls of the panels housings when the panel housings are folded.

A distance from a rotational center of the display panels to one of the display panels is identical to that from the rotational center to the other of the display panels.

When an input device is disposed on the display panels, the distance from the rotational center to the display panel is identical to that from the rotational center to the input device.

When a protecting film is disposed on the display panels, the distance from the rotational center to the display panel is identical to that from the rotational center to the protecting film.

A support is provided on the sidewalls of the panel housings, and the display panels are mounted on the support.

The display panels are mounted on the panel housings by a chassis, the chassis encloses a panel assembly as a single unit.

The chassis further encloses the sidewalls of the contacting border portion of the display panels. In addition, the chassis encloses on the sidewalls of the display panels.

The chassis is provided with a fixing member, the fixing member being supported by hook means formed on the panel housings, and a distance from the sidewall of the contacting border portion of the display panels to the fixing member is identical to that from the sidewall of the contacting border portion the panel housings to the hook means.

The foldable multi display device further comprises cover means mounted on the sidewalls of the panel housings, a longitudinal groove for fixing and receiving the cover means is formed on the sidewalls of the contacting border portion of the panel housings.

The foldable multi display device further comprises a protecting film for covering a screen and the sidewalls of the contacting border portion of the display panels.

BEST MODE FOR CARRYING OUT THE INVENTION

Preferred embodiments of the present invention will be described more in detail hereinafter.

The present invention provides a multi display device having more than two display panels disposed and connected to be adjacent to each other. The display panels are selected from the group consisting of an LCD, an FED, a PDP, and an EL including an organic EL.

FIGS. 1 to 5 show a foldable multi display device according to a preferred embodiment of the present invention.

As shown in the drawings, the foldable multi display device comprises panel housings 20 and 40 and connecting means 6 for supporting the panel housings 20 such that they can be folded on each other and unfolded at 180°.

The connecting means 6 may be a hinge assembly that is disposed on the rotational center of the panel housings 20 and 40.

Display panels 2 and 4 are received in the panel housings 20 and 40, respectively, such that at least one sidewalls thereof can be disposed contacting each other when the panel housings 20 and 40 are unfolded. That is, one sidewalls of the panel housings 20 and 40 are opened to define opening 8. The opening 8 is exposed outside when the panel housings 20 and 40 are folded. The one sidewalls of the display panels 2 and 4 are also exposed outside through the opening 8.

Figure 3:
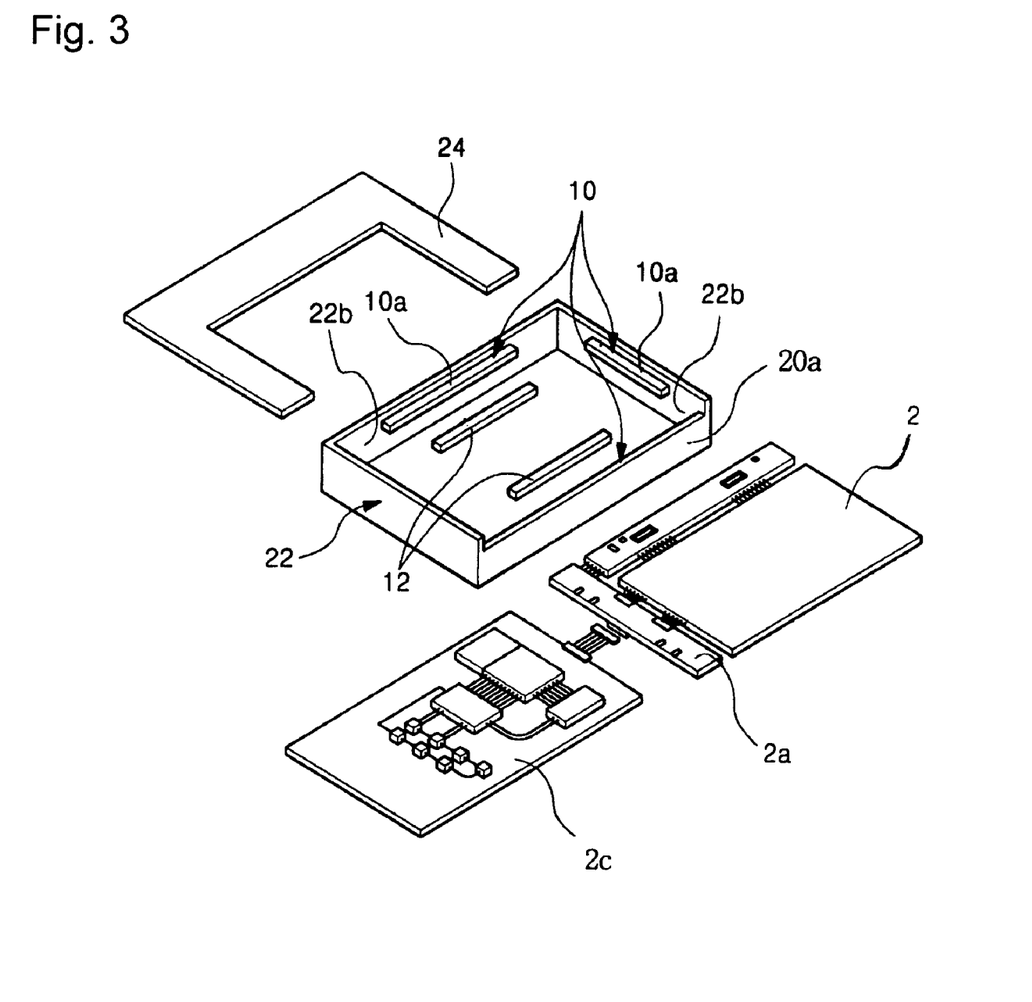
FIG. 3 is an exploded perspective view of one panel housing of a foldable multi display device according to a preferred embodiment of the present invention.
Figure 5:
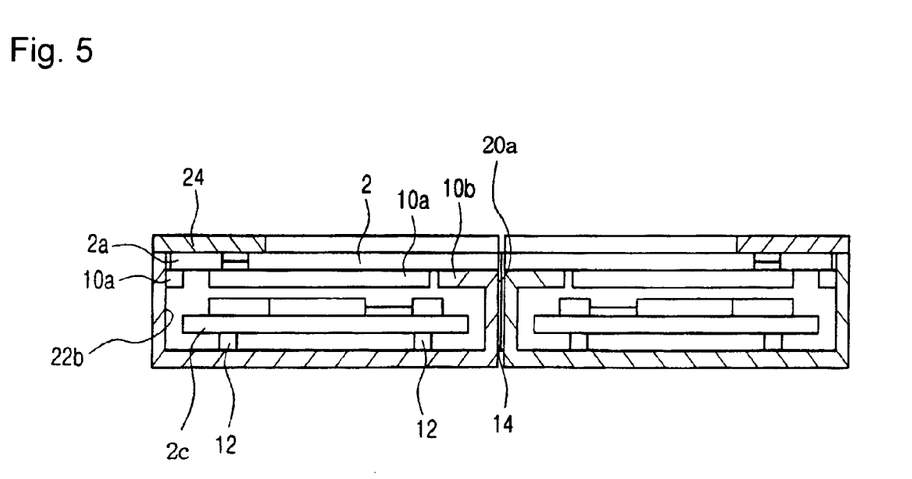
FIG. 5 is a sectional view of a modified example of a supporting portion of the present invention.

Describing more in detail, the panel housing 20 comprises a housing body 22 and a cover 24. The display panel 2 is received in the housing body 22. The housing body 22 is provided with a supporting portion 10 for supporting the display panel 2 at a predetermined height. The supporting portion 10 is formed of a step defined by cutting a sidewall 20a of the housing body 22, proximal to the contacting border portion. A projection 10a is formed on other sidewall 22b so that the display panel 2 is can be located thereon. At this point, the supporting portion 10 defined by cutting the one sidewall 20a may be defined by forming an extension portion 10b so as to more stably support the display panel 2 as shown in FIG. 5.

In the present invention, the display panel 2 comprises a driving circuit 2a or a driving circuit board and/or a backlight. Furthermore, the main circuit board 2c of the display panel is located under the display panel 2, and a second supporting portion 12 is provided on the housing body 22 to support the main circuit board 2c.

A cover 24 is mounted on the display panel 2. The cover 24 covers the non-display area of the display panel 2 disposed on the supporting portion 10. The cover 24 is opened at its one sidewall so that the display panels 2 and 4 can be disposed contacting each other when the display panels 2 and 4 are unfolded. Such opening structure defines the opening 8.

In addition, a protecting film 14 is provided on outer surfaces of the sidewall 20a, proximal to the contacting border portion, of the display panels 2 and 4 and the housing body 22. The protecting film 14 protects the sidewalls when the display panels 2 and 4 are disposed contacting each other, while preventing alien substances from coming inside.

The folding and unfolding operation of the above described multi display device will be described more in detail hereinafter.

Figure 2:
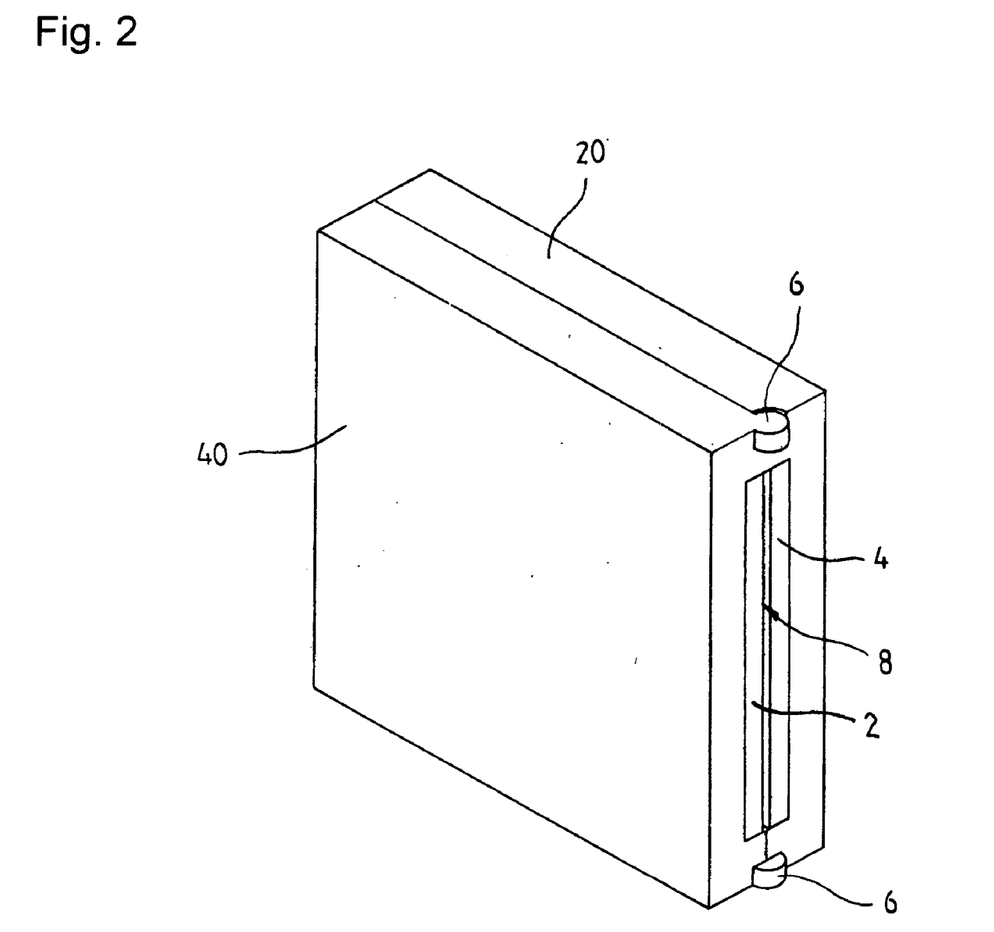
FIG. 2 is a perspective view of a foldable multi display device depicted in FIG. 1 when it is folded.

As shown in FIG. 2, the device can provide the mobile convenience as the panel housing 20 and 40 and the display panels 2 and 4 respectively received in the panel housings 20 and 40 can be folded on each other. The panel housings 20 and 40 receive the display panels 2 and 4 such that only the one sidewalls of the display panels 2 and 4 are exposed when they are folded.

Figure 1:
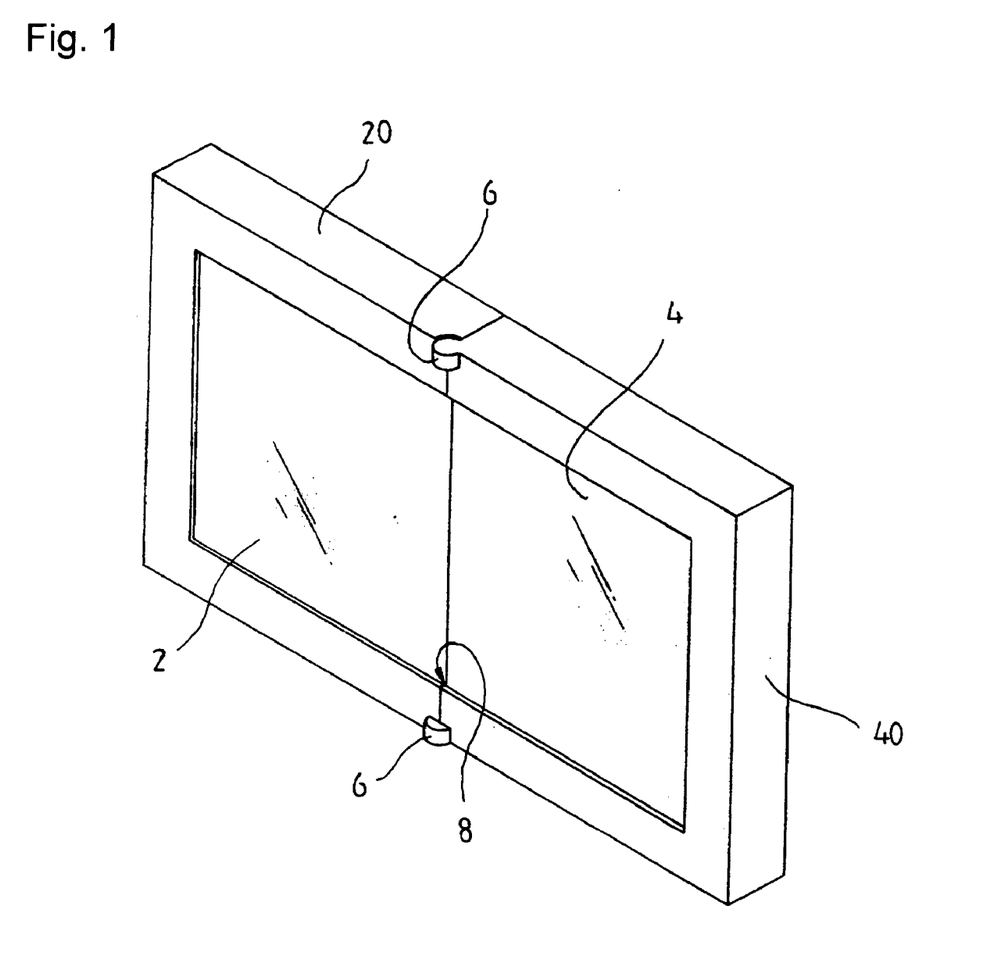
FIG. 1 is a perspective view of a foldable multi display device when it is unfolded according to a preferred embodiment of the present invention.
Figure 4:
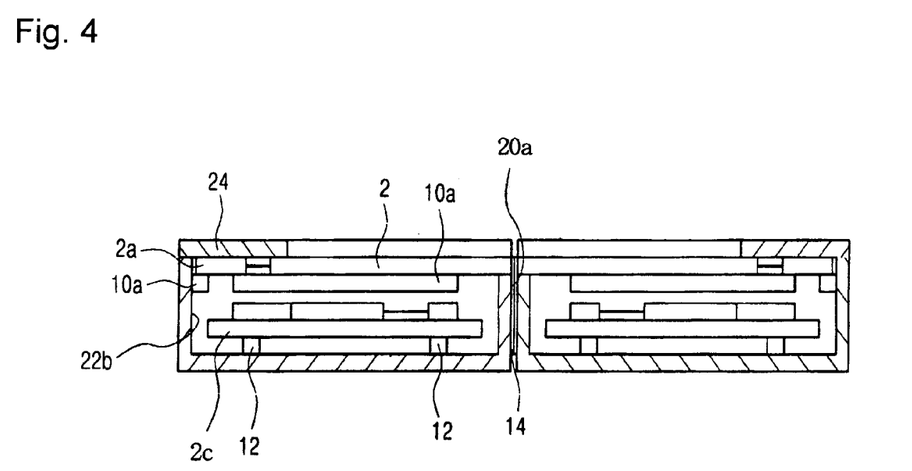
FIG. 4 is a sectional view of a multi display device of the present invention when it is unfolded.

To use the device, as shown in FIGS. 1, 4 and 5, the device is unfolded. At this point, the supporting portions 10 and 12 of the panel housings 20 and 40 stably supports the display panels 2 and 4 so as to prevent the display panels 2 and 4 from moving and to protect the same from the outer shock.

Figure 6:
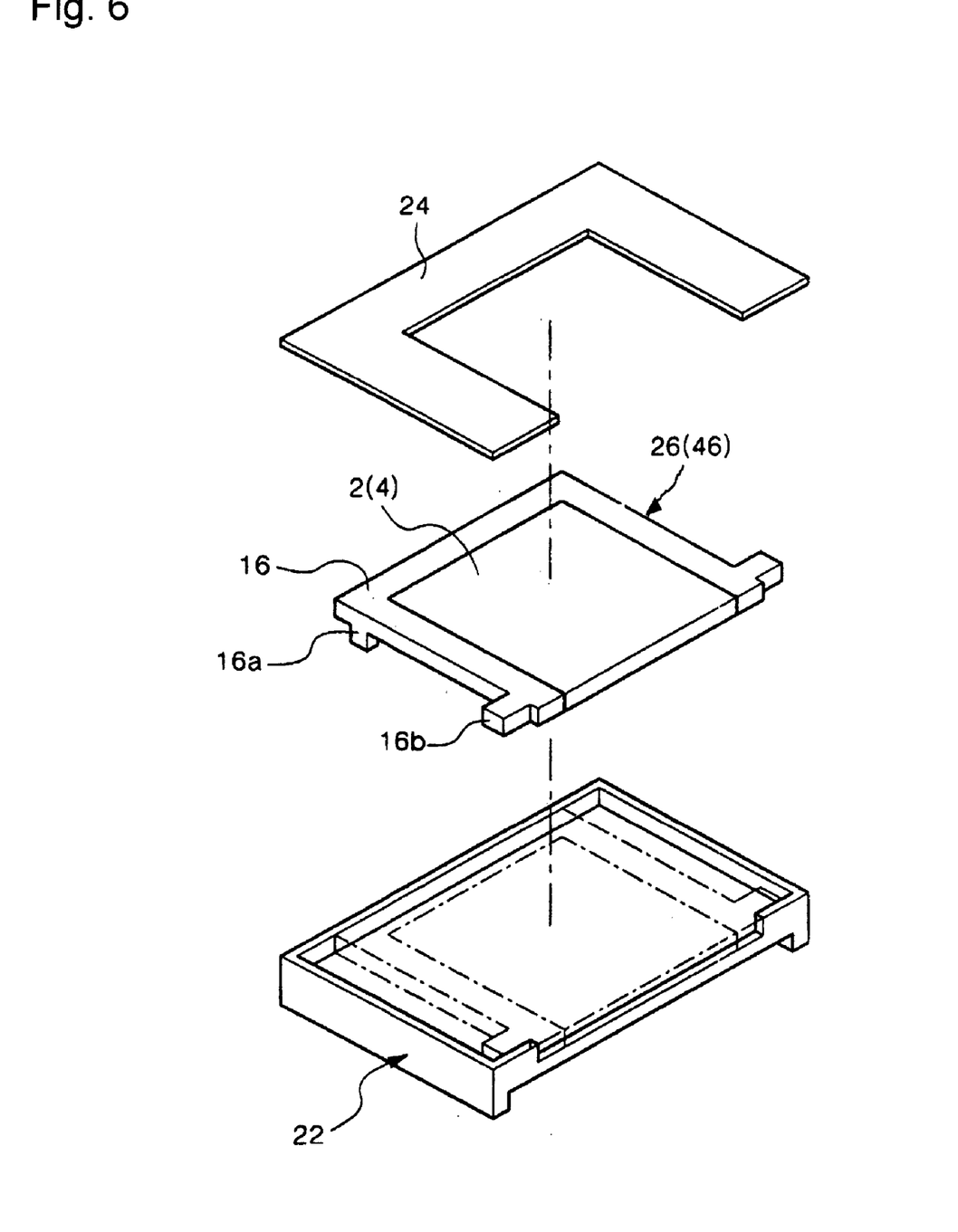
FIGS. 6 and 7 are exploded perspective views of a multi display device according to another embodiment of the present invention.

FIG. 6 shows another embodiment of the present invention.

The display panels 2 and 4 are assembled with the driving IC or the driving circuit board and the backlight and supported by a chassis 16, thereby realizing panel assemblies 26 and 46.

As described above, the panel assemblies 26 and 46 are received in the panel housings 20 and 40 and supported by the supporting portion 10. Instead of the supporting portion 10, a supporting member 16a may be formed extending downward from the chassis 16.

Furthermore, the chassis 16 is provided with a fixing member 16b so as to prevent the panel assemblies 26 and 46 from moving and removing out of the housing bodies 20 and 40 during the folding and unfolding operation. As shown in the drawing, the fixing member 16b is formed on the chassis 16 in a wing-shape.

Figure 7:
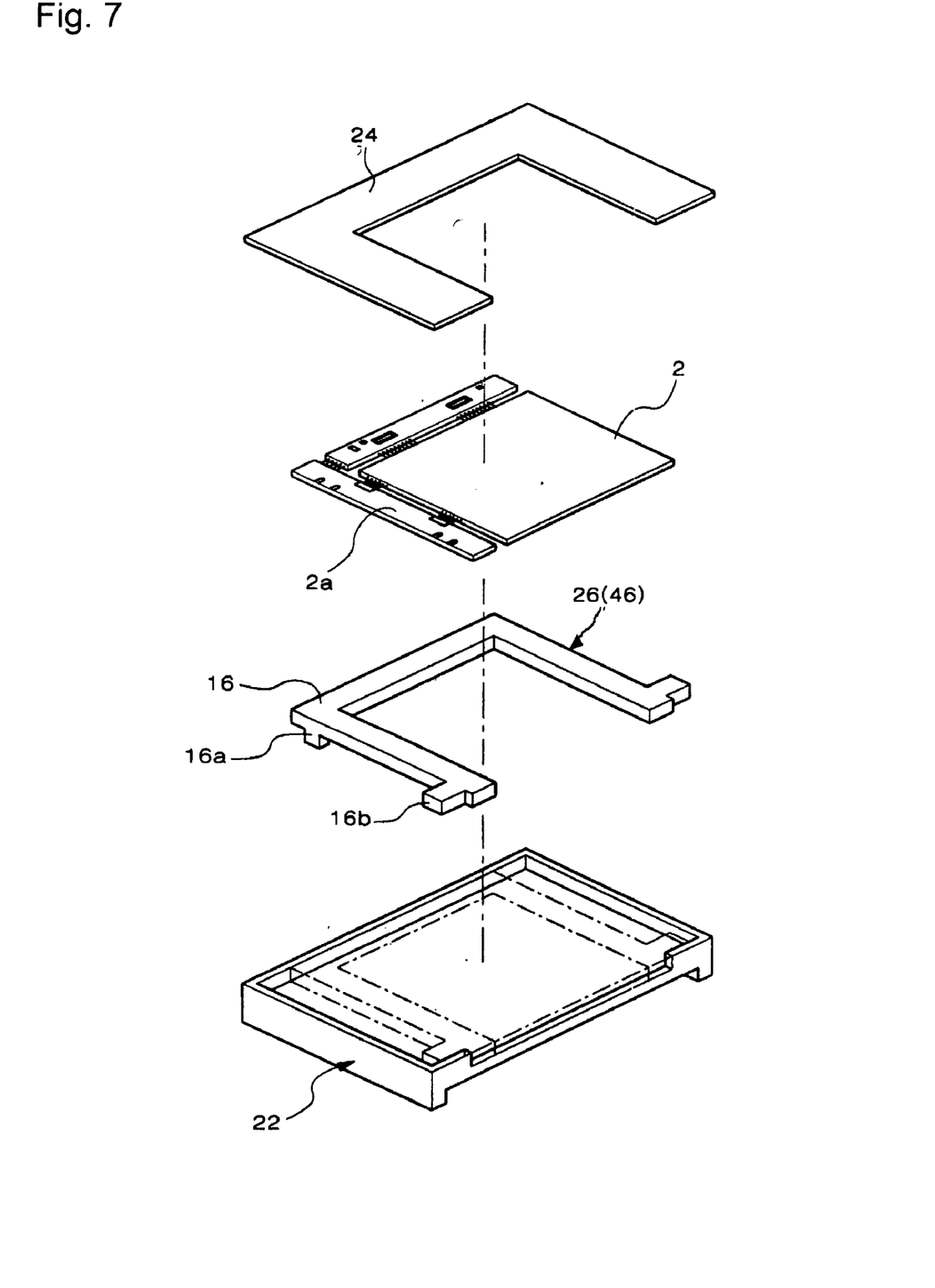

FIG. 7 shows another embodiment of the chassis constituting the panel assemblies.

As shown in the drawing, the chassis 16 is formed of a plate member in a ⊏-shape. The display panels 2 and 4 and the driving IC or driving circuit board and/or the back light is disposed on the chassis 16. At this point, as coupling means for coupling the members to each other, an adhesive may be used. Preferably, the chassis 16 is provided with a supporting member 16a and a fixing member 16b.

Figure 8:
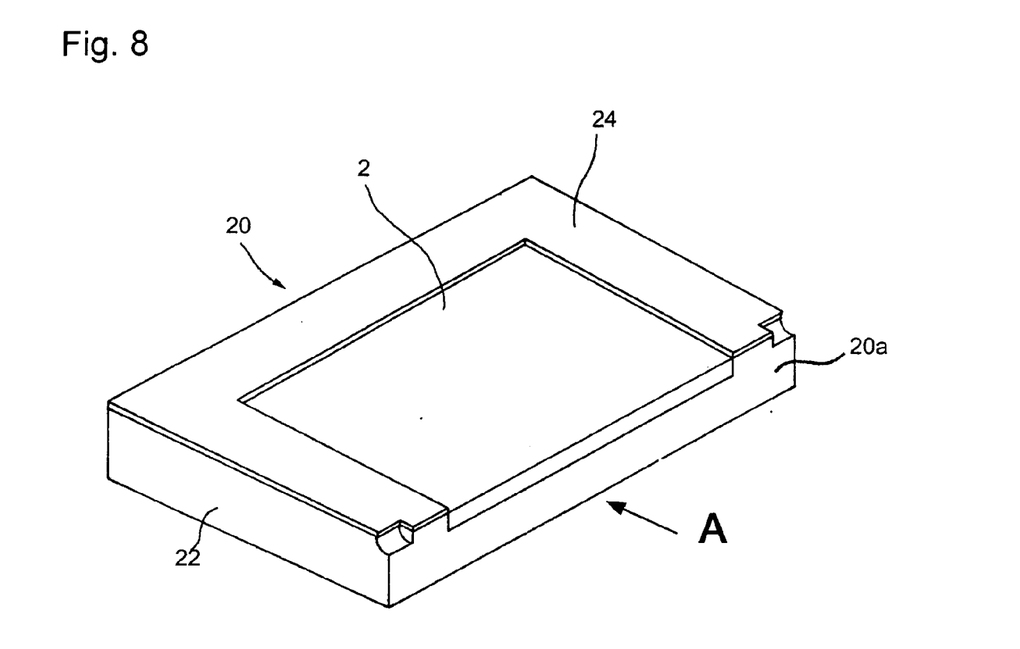
FIG. 8 is a view illustrating an assembly where display panels are assembled in panel housings according to a preferred embodiment of the present invention.

FIG. 8 shows an assembly of the panel housing and the display panel.

As shown in the drawing, the panel housing 20 comprises a housing body 22 and a cover 24. For the convenience of the description, the housing body and the panel housing will be hereinafter referred as "a panel housing."

The panel housing 20 is provided with an opening by cutting a one sidewall thereof, and the display panel is disposed such that a one sidewall thereof lies on an extension line of the one sidewall of the panel housing 20. A cover 24 formed in a ⊏-shape is provided on an outer surface of the panel housing 20 to cover the periphery of the display panel 2. Although not being shown, the panel housing 40 and the display panel 4 are identically structured.

Figure 9:
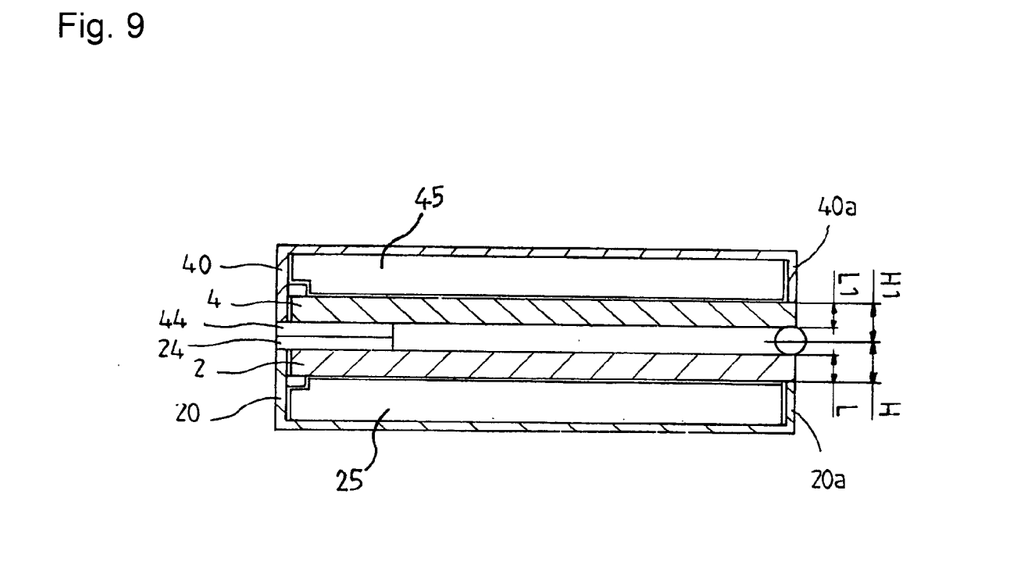
FIG. 9 is a sectional view of FIG. 2.

FIG. 9 shows a sectional view of the panel housings 20 and 40 when they are folded.

As shown in the drawings, the opening 8 is defined by cutting the sidewalls 20a and 40a of the panel housings 20 and 40. The display panels 2 and 4 are disposed such that the sidewalls of the display panels 2 and 4 lies on the extension lines of the sidewall 20a and 40a. When the display device is folded, the gap of the display panels is widened by the covers 24 and 44 so that the display panels can be separated from each other. Circuits and a central process unit or transmission/receiving devices 25 and 45 are mounted on the display panels 2 and 4.

In FIG. 9, when the display device is folded, the gap between the display panels 2 and 4 are preferably established, while satisfying the following equation (1).

$$H-L=H1-L1 \quad (1)$$

Where, H indicates a distance from the sidewall 20a of the panel housing 20 to a rotational center of the device, L indicates a thickness of the display panel 2, H1 indicates a distance from the sidewall 40a of the panel housing 40 to the rotational center, and L1 indicates a thickness of the display panel 4.

Here, the thickness of the display panels means a thickness of the panel assembly or a thickness of the panel assembly including the driving circuit and the backlight.

In the above equation (1), the difference between the distance H and the thickness L is identical to that between the distance H1 and the thickness L1. That is, the straight distance from the rotational center to the display panel 2 (H–L) becomes identical to that from the rotational center to the display panel 4. The identical distance means that distance error less than 1 mm will be allowed.

As described above, when the display panels are folded, the display panels 2 and 4 are mounted on the sidewalls 20a and 40a of the panel housings 20 and 40, which are cut such that the display panels 2 and 4 are identically spaced away from the rotational center. Therefore, simultaneously with unfolding of the display panels 2 and 4, the display panels 2 and 4 contact each other and the height level of the surfaces of the display panels 2 and 4 lie on the same plane as shown in FIG. 1. Furthermore, when an input device such as a touch panel or a protect film is mounted on the display panel, the distances from the rotational center to the input device or the protect film become identical. In the above embodiment, although the opening is defined by cutting the sidewall, the present invention is not limited to this. For example, the opening may be formed by an injection mould.

FIGS. 10a through 10d show a structure when FIG. 8 is viewed in a direction "A."

Figure 10A:
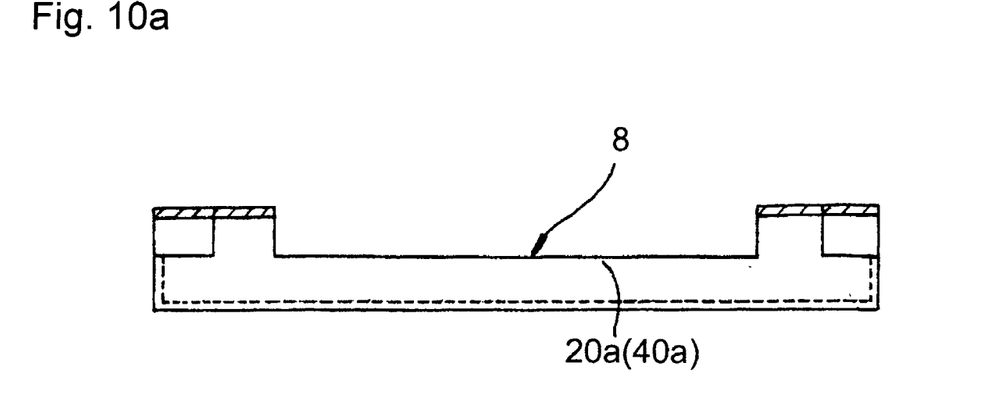
FIGS. 10a to 10d are views of FIG. 8 viewed from a direction A.

FIG. 10a shows sidewalls 20a and 40a of the panel housings 20 and 40, in which the opening 8 is defined by cutting the sidewalls 20a and 40a of the panel housings 20 and 40. The display panels 2 and 4 are mounted on the sidewalls 20a and 40a.

Figure 10B:
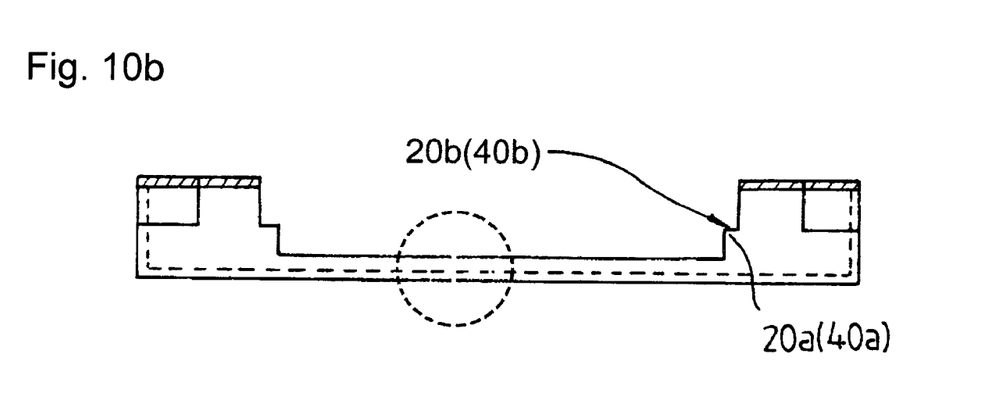

FIG. 10b shows another method for cutting the sidewalls 20a and 40a, in which the display panels 2 and 4 are disposed on the both side ends 20b and 40b of the sidewalls 20a and 40a.

Figure 10C:
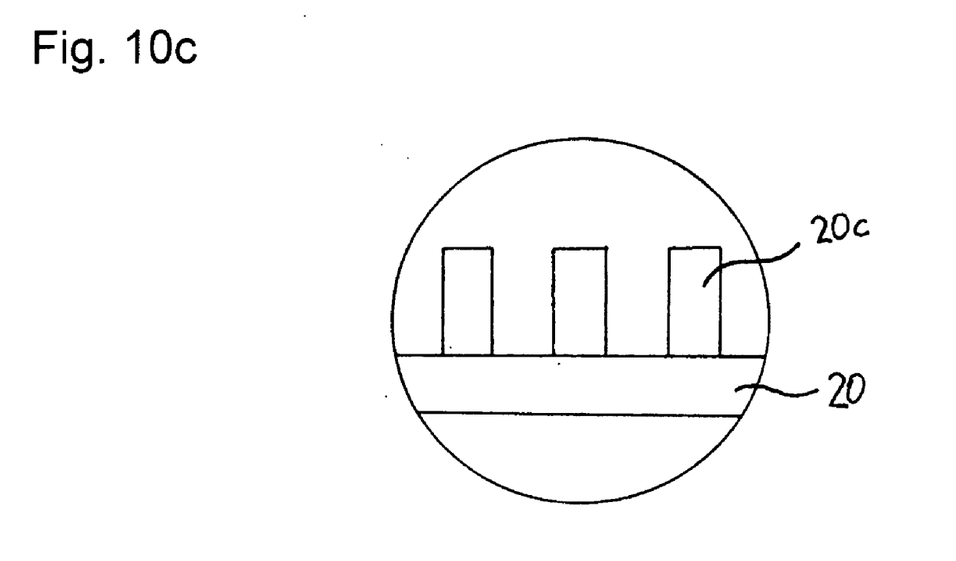
Figure 10D:
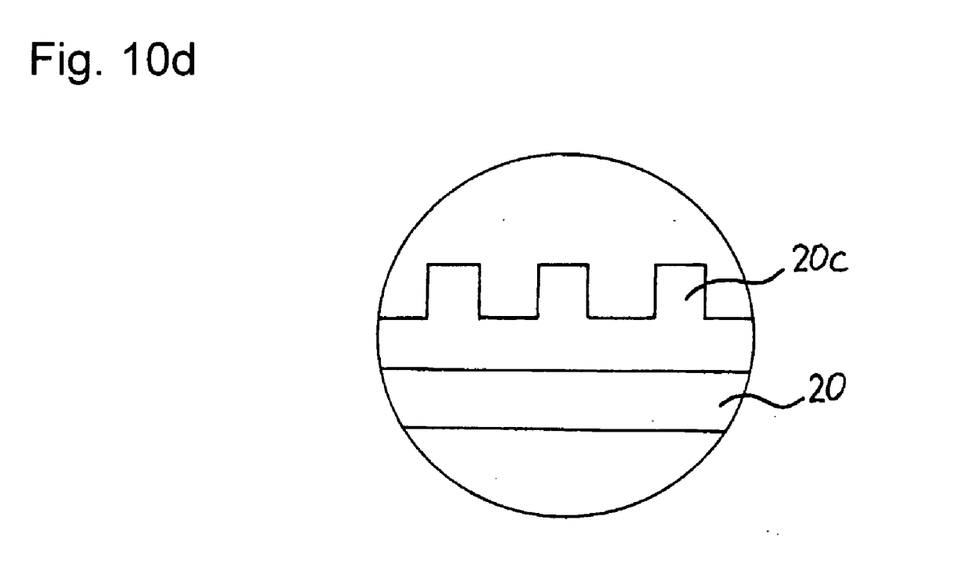

In addition, as shown in FIGS. 10c and 10d, a support 20c is mounted on the sidewalls of the panel housings 20 and 40, and the display panels 2 and 4 may be disposed on the support 20c. That is, after the sidewalls of the panel housing are partly cut, the support 20c is attached, on which the display panels lie.

Figure 11:
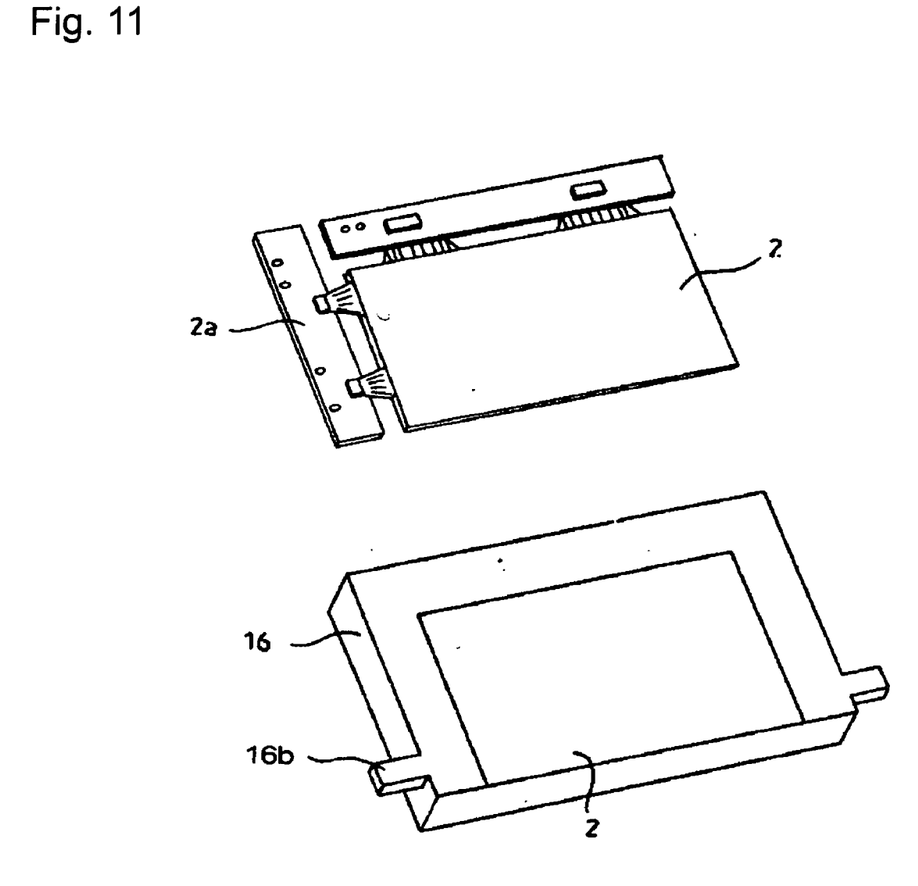
FIG. 11 is a view of a chassis provided with a supporting member according to a preferred embodiment of the present invention.

FIG. 11 shows a chassis of the present invention.

The display panels 2 and 4 are mounted as a panel assembly in the portable display device. The panel assembly includes a display panel 2, a driving circuit 2a and the backlight system. The backlight system is omitted in the drawing for the description convenience. Furthermore, to fix the panel assembly, the display panel 2, the driving circuit 2a and the backlight system is mounted within the chassis 16.

When the display panels 2 and 4 are mounted in the panel housings 20 and 40 with the chassis 16, the display panels 2 and 4 may be removed out of the panel housings 20 and 40 through the opening 8 formed on the sidewalls 20a and 40a of the panel housings 20 and 40 when outer shock is applied. Accordingly, a fixing member 16b is provided on the chassis 16 so that the chassis 16 can be supported on the panel housings 20 and 40 through the fixing member 16b and the display panels 2 and 4 can be stably fixed on the panel housings 20 and 40. Here, the fixing member 16b is projected from the chassis 16 and fixed on the panel housings 20 and 40. The fixing member 16b may be formed in a screw type.

Figure 12:
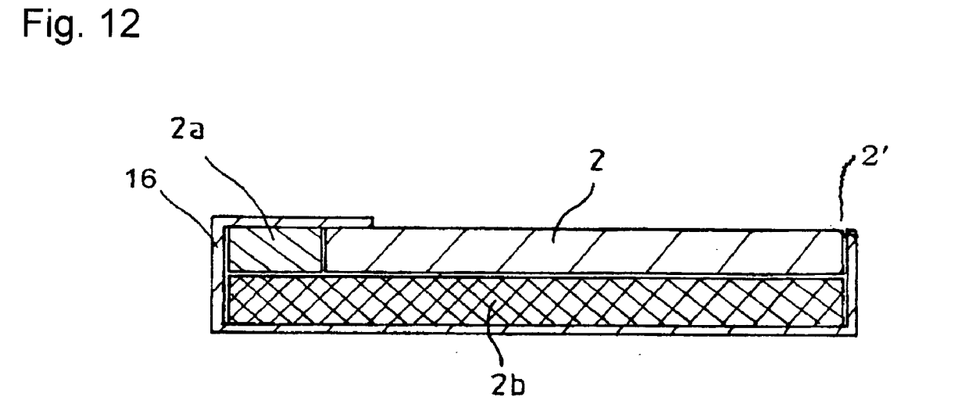
FIG. 12 is a sectional view of a chassis with a panel assembly.

FIG. 12 shows a panel assembly mounted on the chassis.

As shown in the drawing, the chassis 16 encloses the driving circuit 2a and the backlight system 2b as a single unit. In addition, to protect the contacting border portion 2' between the display panels 2 and 4, the chassis 16 is designed to enclose the contacting border portion 2'. The chassis 16 may be divided into a body and a cover. For example, the panel assembly is mounted on the body, and the cover is coupled to the body using a screw or an adhesive. The chassis may be formed of plastic or metal.

Figure 13:
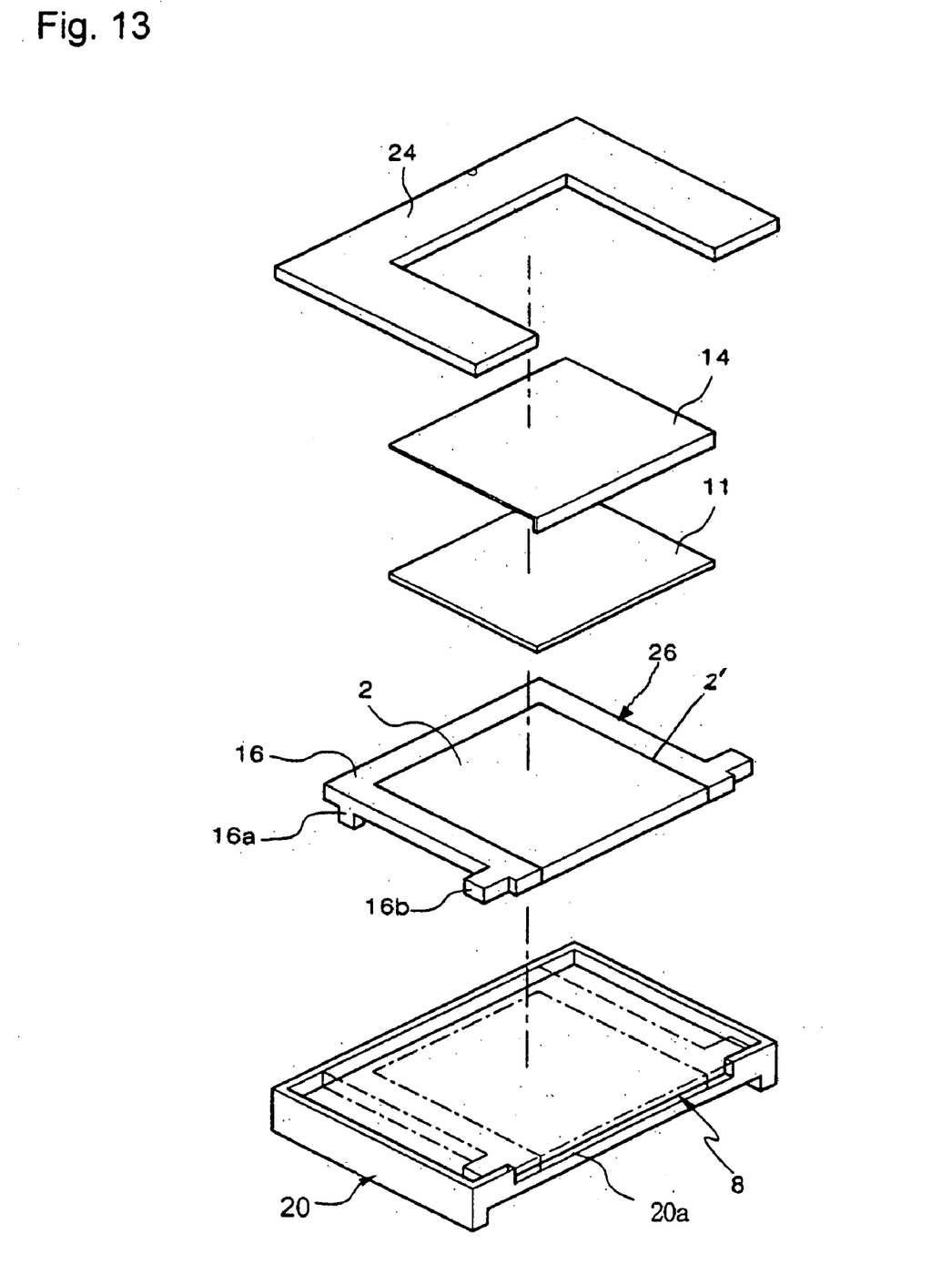
FIG. 13 is a view illustrating a chassis of FIG. 12, mounted on a panel housing.

FIG. 13 shows the panel assembly 26 mounted on the panel housing.

As shown in the drawing, the chassis 16 with the display panels 2 and 4 is fixed on the panel housings 20 and 40 by the fixing member 16b, and the ⊏-shaped cover 24 is disposed on the chassis 16 to protect the display panels 2 and 4 as well as the chassis 16. The contacting border portion is not covered with the cover 24 to minimize the gap thereof.

The protecting film 14 is provided to protect the sidewall of the contacting border portion and the front screen.

The protecting film 14 is formed of a transparent film made of polycarbonate, polyacrylate, or polyethylenephthalate(PET). The protecting film 14 is formed in a ⊓-shape to cover both of the screen and the contacting border portion. Particularly, when the panel housings 20 and 40 are folded, the protecting film 14 protects the sidewalls of the display panels 2 and 4 that are exposed to the outside, thereby preventing the display panels 2 and 4 from undesirably contacting each other and also preventing alien substances from coming inside.

When the input device 11 is mounted on the display panels 2 and 4, the protecting film 14 is designed to cover the surface and sidewall of the input device 11. The protecting member 14 may be formed in a ⊏-shape enclosing the chassis 16 to enhance the adhesiveness of the protecting member 14. As the input device 11, a touch panel is preferably used.

Figure 14:
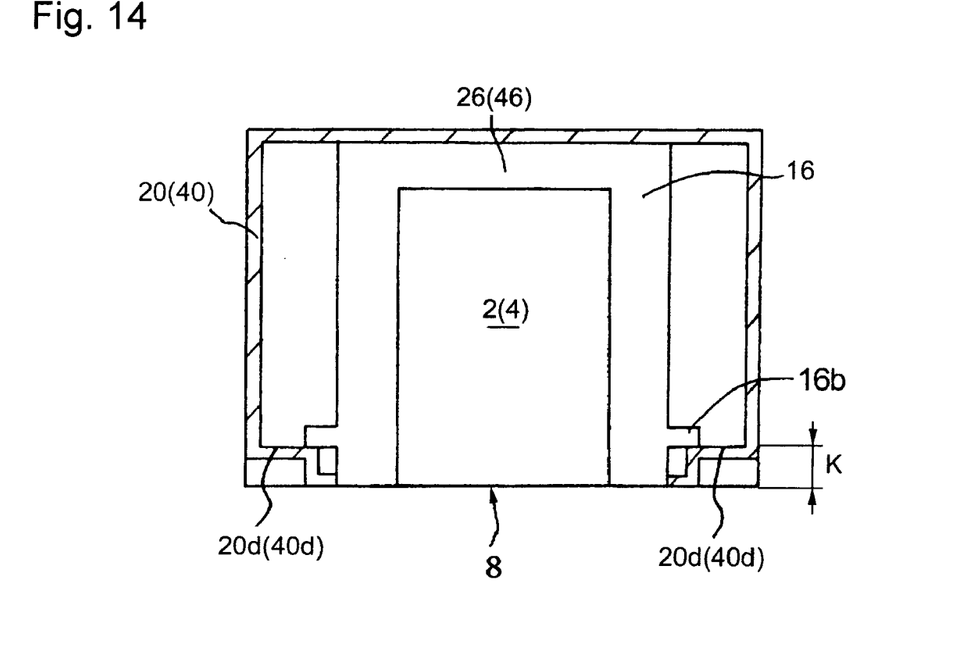
FIG. 14 is a plane view of a chassis mounted on a panel housing.

FIG. 14 shows the chassis fixed on the panel housing.

As shown in the drawing, the contacting border portion of the panel housings 20 and 40 are opened to define the opening 8. The panel assemblies 26 and 46 may be removed through the opening 8 by the outer shock. Accordingly, in the present invention, the panel assemblies 26 and 46 are designed to fixedly coupled to the panel housings 20 and 40 by the fixing member 16b projected from the chassis 16. The fixing member may be alternatively projected from the panel housings 20 and 40 and coupled to the chassis 16.

In FIG. 14, K indicates a distance from the sidewalls of the contacting border portion of the display panels 2 and 4 to the fixing member 16b. The distance K can be a distance from hook means 20d and 40d to the end portions of the panel housings.

As described above, when the chassis 16 is fixed to the panel housings by the fixing member 16b, the sidewalls of the display panels 2 and 4 lie on the same planes of the sidewalls 20a and 40a of the panel housings. That is, the location of the fixing member 16b is determined such that the sidewalls of the display panels 2 and 4 lie on the same planes of the sidewalls 20a and 40a of the panel housings.

Figure 15:
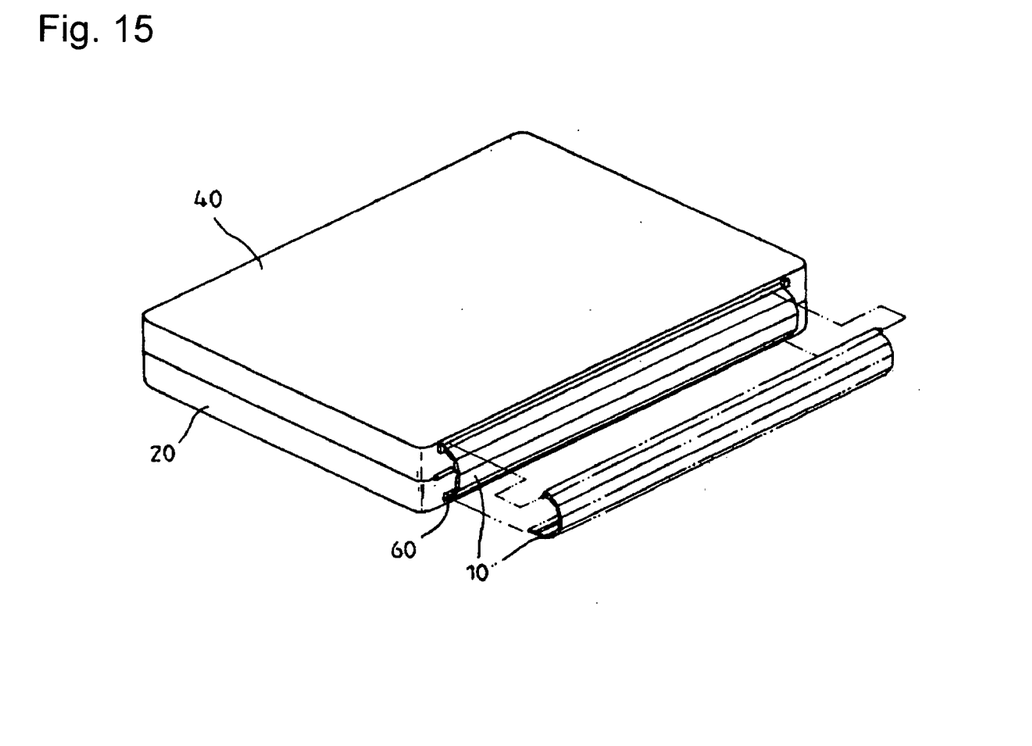
FIG. 15 is a view of structure for mounting cover means to panel housing.

FIG. 15 shows cover means mounted on the panel housings.

When the panel housings 20 and 40 are folded, the display panels 2 and 4 are received inside the panel housings 20 and 40. However, the adjacent sidewalls of the display panels 2 and 4 may be exposed outside through the opening of the panel housings. Therefore, in the present invention, cover means 10 for covering the exposed adjacent sidewalls of the display panels is provided.

At this point, a longitudinal groove 60 is formed on the sidewalls of the panel housings so that the cover means 10 slides into or out of the panel housings 20 and 40 along the groove 60.

INDUSTRIAL APPLICABILITY

As described above, the multi display device can realize a large-sized screen by connecting plural display panels. When the device is unfolded, one sidewalls of the panels disposed to be adjacent to each other, thereby minimizing the non-display area. Particularly, when the device is folded, since only the one sidewalls are exposed outside and other portions are received in the device while being stably supported by the support, thereby preventing the display panels from being damaged by outer shock.

What is claimed is:

1. A foldable multi display device, comprising:
   a housing body receiving at least two display panels;
   a supporting portion for supporting the display panels, the supporting portion being defined by cutting sidewalls, proximal to contacting border portion, of the housing body;
   an upper cover for covering a non-display area of the display panels disposed on the housing body; and
   a panel housing having an opening such that the display panels can be adjacent to each other when the panels are unfolded; and
   a protecting film disposed on side walls of the contacting border portion of the display panels and the housing body.

2. A foldable multi display device of claim 1 further comprising connecting means for supporting the panel housings such that they can be folded on each other and unfolded at 180°.

3. A foldable multi display device of claim 2 wherein the connecting means comprises a hinge assembly mounted on a rotational center of the panel housing.

4. A foldable multi display device of claim 1 wherein the supporting portion comprises a projection installed on other sidewall of the housing body.

5. A foldable multi display device of claim 1 wherein the housing body further comprises a second supporting portion for supporting a driving circuit board and/or a backlight.

6. A foldable multi display device of claim 1 the supporting portion comprises an extension portion extending inside.

7. A foldable multi display device of claim 1 wherein the display panel is assembled with driving circuit board and/or a backlight by a chassis, and the chassis comprises a fixing member for preventing the panel assembly from moving.

8. A foldable multi display device of claim 7 wherein the chassis further comprises a supporting member for maintaining the panel assembly at a predetermined height.

9. A foldable multi display device of claim 1 wherein the display panel is disposed on the chassis made of plate member.

10. A foldable multi display device of claim 1 further comprising cover means mounted on a sidewall of the panel housing, and a longitudinal groove for fixing and receiving the cover means formed on the sidewall of the contacting border portion of the panel housing.

11. A multi display device comprising:
    at least two panel housings with plural circuits and a central process unit, the panel housing being foldable; and
    display panels mounted on the panel housings; and
    a protecting film disposed on sidewalls of the contacting border portion of the display panels and the housing body,
    wherein a contacting border portion of the display panels is co-planar with the sidewalls of the panels housings when the panel housings are folded.

12. A foldable multi display device of claim 11 wherein a distance from a rotational center of the panel housings to one of the display panels is identical to that from the rotational center to the other of the display panels.

13. A foldable multi display device of claim 12 wherein when input devices are disposed on the display panels, the distance from the rotational center to an input device is identical to that from the rotational center to the other of the input devices.

14. A foldable multi display device of claim 12 wherein when protecting films are disposed on the display panels, the distance from the rotational center to a protecting film is identical to that from the rotational center to the other of the protecting films.

15. A foldable multi display device of claim 11 wherein a support is provided on the sidewalls of the panel housings, and the display panels are mounted on the support.

16. A foldable multi display device of claim 11 wherein the display panels are mounted on the panel housings by a chassis, the chassis encloses the driving circuit board and/or the backlight as a single unit.

17. A foldable multi display device of claim 16 wherein the chassis further encloses the other sidewalls than the sidewalls of the contacting border portion of the display panels.

18. A foldable multi display device of claim 17 wherein the chassis is coplanar with the sidewalls of the display panels.

19. A foldable multi display device of claim 16 wherein the chassis is provided with a fixing member, the fixing member being supported by hook means formed on the panel housings, a distance from the sidewall of the contacting border portion of the display panel to the fixing member is identical to that from the sidewall of the contacting border portion of the panel housings to the hook means.

20. A foldable multi display device of claim 11 further comprising cover means mounted on the sidewalls of the panel housings, and a longitudinal groove formed on the sidewalls of the contacting border portion of the panel housings.

21. A foldable multi display device of claim 11 further comprising a protecting film for covering a screen of the display panels and the sidewalls of the contacting border portion of the display panels.

* * * * *